United States Patent
Wang et al.

(10) Patent No.: US 8,754,411 B2
(45) Date of Patent: Jun. 17, 2014

(54) ACTIVE DEVICE

(71) Applicant: E Ink Holdings Inc., Hsinchu (TW)

(72) Inventors: Chih-Hsuan Wang, Hsinchu (TW);
Chia-Chun Yeh, Hsinchu (TW);
Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 13/726,652

(22) Filed: Dec. 26, 2012

(65) Prior Publication Data

US 2013/0256655 A1    Oct. 3, 2013

(30) Foreign Application Priority Data

Mar. 28, 2012    (TW) .............................. 101110796 A

(51) Int. Cl.
*H01L 29/78*    (2006.01)

(52) U.S. Cl.
USPC .......................................... 257/43; 438/149

(58) Field of Classification Search
USPC ................ 257/43, E21.28, E51.005, E29.151
See application file for complete search history.

(56) References Cited

U.S. PATENT DOCUMENTS

| | | |
|---|---|---|
| 2010/0081231 A1* | 4/2010 | Hirata et al. .................. 438/102 |
| 2010/0109004 A1 | 5/2010 | Arai |
| 2010/0200843 A1 | 8/2010 | Arai et al. |
| 2011/0180802 A1 | 7/2011 | Morosawa et al. |
| 2011/0266542 A1 | 11/2011 | Ryu et al. |
| 2011/0299005 A1* | 12/2011 | Takeguchi et al. .............. 349/46 |
| 2013/0009161 A1* | 1/2013 | Himori ........................... 257/60 |
| 2013/0037793 A1* | 2/2013 | Pan et al. ........................ 257/43 |

* cited by examiner

*Primary Examiner* — Thao P Le
(74) *Attorney, Agent, or Firm* — Jianq Chyun IP Office

(57) ABSTRACT

An active device is disposed on a substrate. The active device includes a metal layer, a semiconductor channel layer, an insulating layer, a source and a drain. The metal layer has a metal oxide surface away from the substrate. The insulating layer is disposed between the metal layer and the semiconductor channel layer. The source and the drain are disposed at one side of the semiconductor channel layer. A portion of the semiconductor channel layer is exposed between the source and the drain. An orthogonal projection of the metal layer on the substrate at least covers an orthogonal projection of the portion of the semiconductor channel layer exposed by the source and the drain on the substrate.

10 Claims, 1 Drawing Sheet

ACTIVE DEVICE

CROSS-REFERENCE TO RELATED APPLICATION

This application claims the priority benefit of Taiwan application Ser. No. 101110796, filed on Mar. 28, 2012. The entirety of the above-mentioned patent application is hereby incorporated by reference herein and made a part of this specification.

BACKGROUND OF THE INVENTION

1. Field of the Invention

The present invention relates to a semiconductor device, and more particularly, to an active device.

2. Description of Related Art

Taking the currently most popular liquid crystal display as an example, it mainly consists of a thin film transistor (TFT) array substrate, a color filter substrate, and a liquid crystal layer interposed between the TFT array substrate and the color filter substrate. In a typical TFT array substrate, amorphous silicon (a-Si) TFTs or low-temperature poly-silicon TFTs are usually used as switching elements for various sub-pixels. In recent years, studies have shown that an oxide semiconductor TFT has higher carrier mobility than the a-Si TFT, and the oxide semiconductor TFT is advantageous over the low-temperature poly-silicon TFT in large-area and low-cost fabrication. Therefore, the oxide semiconductor TFT has the potential to become a key element for the next-generation flat panel display. However, the oxide semiconductor TFT is very sensitive to oxygen molecules in the atmosphere and readily absorbs oxygen or moisture thus affecting electricity and stability of the entire device. Therefore, how to effectively prevent oxygen and moisture from entering into the oxide semiconductor TFT has become a very important subject.

SUMMARY OF THE INVENTION

Accordingly, the present invention is directed to an active device which utilizes a metal oxide surface of a metal layer to improve electricity and stability of the entire device that would be affected if moisture and oxygen penetrate into a semiconductor channel layer.

An embodiment of the invention provides an active device. The active device is disposed on a substrate and includes a metal layer, a semiconductor channel layer, an insulating layer, a source and a drain. The metal layer has a metal oxide surface away from the substrate. The insulating layer is disposed between the metal layer and the semiconductor channel layer. The source and the drain are disposed at one side of the semiconductor channel layer. A portion of the semiconductor channel layer is exposed between the source and the drain. An orthogonal projection of the metal layer on the substrate at least covers an orthogonal projection of the portion of the semiconductor channel layer exposed by the source and the drain on the substrate.

In one embodiment of the present invention, the above-mentioned semiconductor channel layer is disposed between the metal layer and the substrate, and the source and the drain are disposed between the insulating layer and the substrate.

In one embodiment of the present invention, the above-mentioned active device further includes a gate disposed between the semiconductor channel layer and the substrate.

In one embodiment of the present invention, the above-mentioned active device further includes a gate insulating layer disposed between the gate and the semiconductor channel layer.

In one embodiment of the present invention, a material of the above-mentioned semiconductor channel layer includes indium-gallium-zinc oxide (IGZO), zinc oxide (ZnO) or indium-zinc oxide (IZO).

In one embodiment of the present invention, a material of the above-mentioned metal layer is aluminium, and the metal oxide surface is an aluminium oxide surface.

In one embodiment of the present invention, a material of the above-mentioned insulating layer includes an organic insulating material or an inorganic insulating material.

In one embodiment of the present invention, the above-mentioned organic insulating material includes polyimide (PI) or resin.

In one embodiment of the present invention, the above-mentioned inorganic insulating material includes silicon oxide (SiOx) or silicon nitride (SiNx).

In one embodiment of the present invention, an oxygen content of the above-mentioned metal oxide surface decreases gradually from one side of the metal layer away from the substrate to the other side of the metal layer adjacent the substrate.

In view of the foregoing, since the metal layer of embodiments of the present invention has a metal oxide surface, it can effectively prevent the oxygen and moisture from entering into the semiconductor channel layer, such that the active device has good stability and electricity.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1:
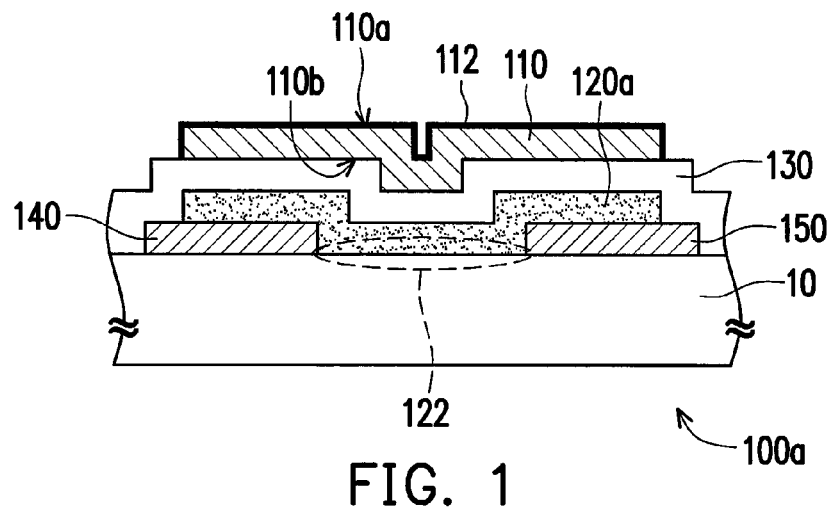
FIG. 1 is a cross-sectional view of an active device according to one embodiment of the present invention.

FIG. 1 is a cross-sectional view of an active device according to one embodiment of the present invention. Referring to FIG. 1, in the present embodiment, the active device 100a is adapted to be disposed on a substrate 10. A material of the substrate 10 is, for example, glass, plastic or another suitable material. The active device 100a includes a metal layer 110, a semiconductor channel layer 120a, an insulating layer 130, a source 140 and a drain 150. The source 140/drain 150, semiconductor channel layer 120a, insulating layer 130 and metal layer 110 are sequentially stacked on the substrate 10.

Specifically, the metal layer 110 includes a metal oxide surface 112 away from the substrate 10. An oxygen content of the metal oxide layer 112 gradually decreases from one side 110a of the metal layer 110 away from the substrate 10 to the other side 110b of the metal layer 110 that is adjacent the substrate 10 and reacting with the outside oxygen. In this embodiment, a material of the metal layer 110 is, for example, aluminium, and the metal oxide surface 112 is a highly densed aluminium oxide layer. It is noted that the metal layer 110 here serves as a gate in the present embodiment.

The insulating layer 130 is disposed between the metal layer 110 and the semiconductor channel layer 120a, and the semiconductor channel layer 120a is disposed between the metal layer 110 and the substrate 10. A material of the semiconductor channel layer 120a is, for example, indium-gallium-zinc oxide (IGZO), zinc oxide (ZnO) or indium-zinc oxide (IZO), but the semiconductor channel layer 120a is not limited to any material exemplified herein. A material of the insulating layer 130 is, for example, an organic insulating material or an inorganic insulating material. The organic insulating material is, for example, polyimide (PI) or resin, and the inorganic insulating material is, for example, silicon oxide (SiOx) or silicon nitride (SiNx).

The source 140 and the drain 150 are both disposed below the semiconductor channel layer 120a and between the insulating layer 130 and the substrate 10. A portion 122 of the semiconductor channel layer 120a is exposed between the source 140 and the drain 150. More specifically, the source 140 and the drain 150 are first formed on the substrate 10, and then the semiconductor channel layer 120a is formed on the source 140, drain 150 and the substrate 10 exposed between the source 140 and the drain 150. That is, the source 140, the drain 150 and the portion 122 of the semiconductor channel layer 120a are substantially coplanar. In particular, in this embodiment, an orthogonal projection of the metal layer 110 on the substrate 10 at least covers an orthogonal projection of the portion 122 of the semiconductor channel layer 120a exposed by the source 140 and the drain 150 on the substrate 10. As shown in FIG. 1, the active device 100a of the present embodiment that is formed by the metal layer 110, semiconductor channel layer 120a, insulating layer 130, source 140 and drain 150 is substantially a top gate thin film transistor (TFT).

In the present embodiment, a material of the metal layer 110 is aluminium. Aluminium is a metal with a low standard reduction potential (E=−1.66V), and can be easily combined with oxygen molecules in the atmosphere to produce aluminium oxide ($Al_2O_3$) on the surface of the aluminium, i.e. the metal oxide surface 112 of the present embodiment. Since the aluminium oxide is a dense oxide, the dense aluminium oxide layer formed on the surface of the aluminium can effectively prevent penetration of the oxygen and act as a barrier such that the element layer below the aluminium material is not readily subject to the invasion of moisture and oxygen. In short, because the metal layer 110 of the embodiment of the present invention has a metal oxide surface 112, it can effectively prevent the oxygen and moisture from entering into the semiconductor channel layer 120a below the metal layer 110, such that the active device 100a has good stability and electricity.

Figure 2:
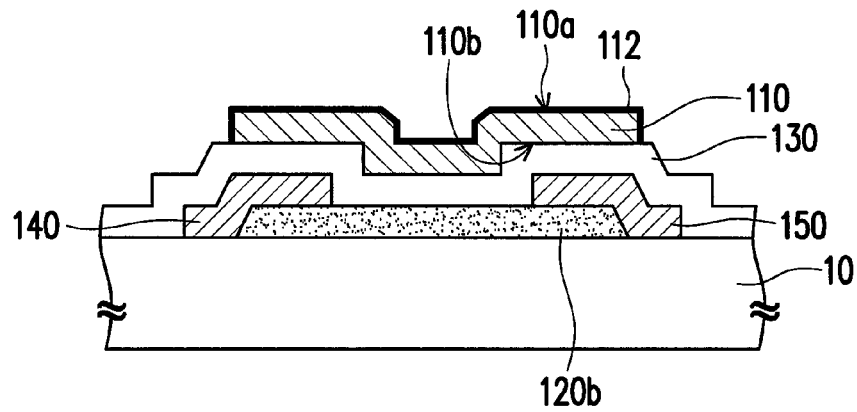
FIG. 2 is a cross-sectional view of an active device according to another embodiment of the present invention.

FIG. 2 is a cross-sectional view of an active device according to another embodiment of the present invention. The present embodiment continues using the element reference numerals and some contents of the previous embodiment, where the same reference numerals are used to refer to same or similar elements, and explanation of those contents that are the same as in the previous embodiment is omitted herein. The previous embodiment may be referred for those omitted contents which are not repeated herein.

Referring to FIG. 2, the active device 100b of the present embodiment differs from the active device 100a of the previous embodiment mainly in the manner of stacking the semiconductor channel layer 120b, source 140 and drain 150. In the present embodiment, the active element 100b is first formed on the substrate 10 of the semiconductor channel layer 120b, and the source 140/drain 150, insulating layer 130 and metal layer 110 are then sequentially stacked on the semiconductor channel layer 120b.

Figure 3:
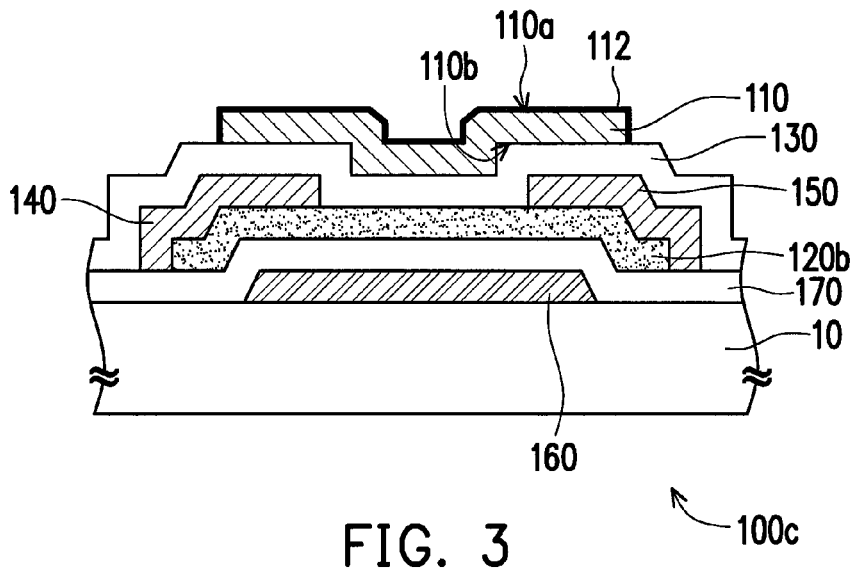
FIG. 3 is a cross-sectional view of an active device according to still another embodiment of the present invention.

FIG. 3 is a cross-sectional view of an active device according to still another embodiment of the present invention. The present embodiment continues using the element reference numerals and some contents of the previous embodiment, where the same reference numerals are used to refer to same or similar elements, and explanation of those contents that are the same as in the previous embodiment is omitted herein. The previous embodiment may be referred for those omitted contents which are not repeated herein.

Referring to FIG. 3, the active device 100c of the present embodiment differs from the active device 100b of the previous embodiment mainly in that the active device 100c of the present embodiment further includes a gate 160 and a gate insulating layer 170. Specifically, in the present embodiment, the gate 160 is disposed between the semiconductor channel layer 120b and the substrate 10, and the gate insulating layer 170 is disposed between the gate 160 and the semiconductor channel layer 120b. In this case, the metal layer 110 serves as an electrically-conductive layer, i.e. for example, a lower electrode layer of an electro-phoretic display (EPD) panel (not shown) or a liquid crystal display (LCD) panel (not shown), which has both the electrically-conductive function and the moisture/oxygen blocking function. In addition, as shown in FIG. 3, the active device 100c of the present embodiment that is formed by the metal layer 110, semiconductor channel layer 120b, insulating layer 130, source 140, drain 150, gate 160 and gate insulating layer 170 is substantially a bottom gate TFT.

In summary, since the metal layer of embodiments of the present invention has a metal oxide surface, it can effectively prevent the oxygen and moisture from entering into the semiconductor channel layer, such that the active device has good stability and electricity.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents. In addition, terms such as "the first" and "the second" used in the specification and claims are for the purposes of naming the elements or distinguishing different embodiment or scope and are not intended to define the upper limit or lower limit of the number of the elements.

What is claimed is:

1. An active device disposed on a substrate, the active device comprising:
    a metal layer comprising a metal oxide surface away from the substrate;
    a semiconductor channel layer;
    an insulating layer disposed between the metal layer and the semiconductor channel layer;
    a source disposed at one side of the semiconductor channel layer; and
    a drain disposed at the side of the semiconductor channel layer, wherein a portion of the semiconductor channel layer is exposed between the source and the drain, and an orthogonal projection of the metal layer on the substrate at least covers an orthogonal projection of the portion of the semiconductor channel layer exposed by the source and the drain on the substrate.

2. The active device as claimed in claim 1, wherein the semiconductor channel layer is disposed between the metal layer and the substrate, and the source and the drain are disposed between the insulating layer and the substrate.

3. The active device as claimed in claim 1, further comprising a gate disposed between the semiconductor channel layer and the substrate.

4. The active device as claimed in claim 3, further comprising a gate insulating layer disposed between the gate and the semiconductor channel layer.

5. The active device as claimed in claim 1, where a material of the semiconductor channel layer comprises indium-gallium-zinc oxide, zinc oxide or indium-zinc oxide.

6. The active device as claimed in claim 1, wherein a material of the metal layer is aluminium and the metal oxide surface is an aluminium oxide surface.

7. The active device as claimed in claim 1, wherein a material of the insulating layer comprises an organic insulating material or an inorganic insulating material.

8. The active device as claimed in claim 7, wherein the organic insulating material comprises polyimide or resin 9. The active device as claimed in claim 1, wherein the inorganic insulating material comprises silicon oxide (SiOx) or silicon nitride (SiNx).

10. The active device as claimed in claim 1, wherein an oxygen content of the metal oxide surface decreases gradually from one side of the metal layer away from the substrate to the other side of the metal layer adjacent the substrate.

* * * * *